United States Patent
Salter et al.

(10) Patent No.: US 10,145,881 B1
(45) Date of Patent: Dec. 4, 2018

(54) AUTONOMOUS VEHICLE MAINTENANCE SELF-CHARGE

(71) Applicant: Ford Global Technologies, LLC, Dearborn, MI (US)

(72) Inventors: Stuart C. Salter, White Lake, MI (US); Annette Lynn Huebner, White Lake, MI (US); Pietro Buttolo, Dearborn Heights, MI (US); Brent Young, Seattle, WA (US); Gerardo Lucena, Dexter, MI (US); Sean Grant, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/723,408

(22) Filed: Oct. 3, 2017

(51) Int. Cl.
 *G01R 31/00* (2006.01)
 *G05D 1/00* (2006.01)
 *B60L 11/18* (2006.01)

(52) U.S. Cl.
 CPC ........ *G01R 31/006* (2013.01); *B60L 11/1862* (2013.01); *G05D 1/0088* (2013.01); *B60L 2240/36* (2013.01); *B60L 2240/545* (2013.01)

(58) Field of Classification Search
 CPC ............... G01R 31/006; B60L 11/1862; B60L 11/1861; B60L 11/1851; G05D 1/008
 See application file for complete search history.

(56) References Cited

U.S. PATENT DOCUMENTS

| | | | |
|---|---|---|---|
| 8,164,301 B2 | 4/2012 | Uchida | |
| 8,700,284 B2 | 4/2014 | Wojtkowicz et al. | |
| 2016/0055743 A1 | 2/2016 | Raj | |
| 2017/0315557 A1* | 11/2017 | Vogt | G05D 1/0225 |

FOREIGN PATENT DOCUMENTS

| | | |
|---|---|---|
| CN | 202294099 U | 7/2012 |
| DE | 102010010119 A1 | 9/2011 |
| DE | 102016003532 A1 | 11/2016 |
| JP | H05286437 | 11/1993 |

\* cited by examiner

*Primary Examiner* — Jacob Amick
(74) *Attorney, Agent, or Firm* — Frank A. MacKenzie; Bejin Bieneman PLC

(57) ABSTRACT

A vehicle computer includes a memory and a processor programmed to execute instructions stored in the memory. The instructions include performing a self-check operation on a host vehicle after the host vehicle exits a manufacturing plant and before the host vehicle proceeds with a delivery process. The self-check operation includes measuring a battery charge, comparing the battery charge to a predetermined threshold, and commanding an autonomous vehicle controller to proceed with the delivery process as a result of determining that the battery charge exceeds the predetermined value.

20 Claims, 4 Drawing Sheets

AUTONOMOUS VEHICLE MAINTENANCE SELF-CHARGE

BACKGROUND

The Society of Automotive Engineers (SAE) has defined multiple levels of autonomous vehicle operation. At levels 0-2, a human driver monitors or controls the majority of the driving tasks, often with no help from the vehicle. For example, at level 0 ("no automation"), a human driver is responsible for all vehicle operations. At level 1 ("driver assistance"), the vehicle sometimes assists with steering, acceleration, or braking, but the driver is still responsible for the vast majority of the vehicle control. At level 2 ("partial automation"), the vehicle can control steering, acceleration, and braking under certain circumstances without human interaction. At levels 3-5, the vehicle assumes more driving-related tasks. At level 3 ("conditional automation"), the vehicle can handle steering, acceleration, and braking under certain circumstances, as well as monitoring of the driving environment. Level 3 requires the driver to intervene occasionally, however. At level 4 ("high automation"), the vehicle can handle the same tasks as at level 3 but without relying on the driver to intervene in certain driving modes. At level 5 ("full automation"), the vehicle can handle almost all tasks without any driver intervention.

DETAILED DESCRIPTION

Figure 1:
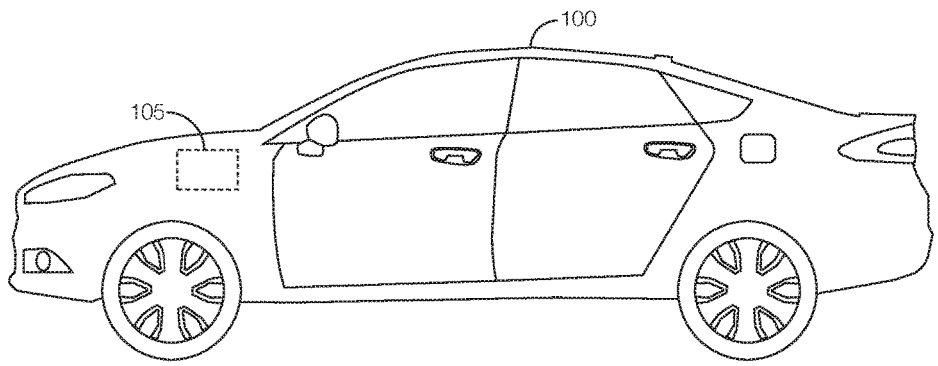
FIG. 1 illustrates an example autonomous vehicle with a self-check system.

Vehicles must travel from a manufacturing plant to the end customer. A transportation service, such as a rail car, ship, or truck, is often used to transport assembled vehicles to a dealership. A person needs to drive non-autonomous vehicles from the manufacturing plant to the transportation service. Before doing so, the person will check the vehicle battery and tire pressure to make sure both are sufficient for transport. If the battery charge, tire pressure, or both, are low, the vehicle is serviced before transport. If the battery charge and tire pressure are above certain thresholds, the vehicle is manually driven to the transport location where, e.g., it can be loaded onto a rail car, ship, or truck.

Autonomous vehicles can drive to the transport location without a human driver. Since a human driver is not present, nobody is available to check the battery and tire pressure of the autonomous vehicle before it proceeds to the transport location. Thus, there is a risk that the autonomous vehicle can be transported with a low battery, low tire pressure, or both.

One way to prevent that from happening is with a self-check system, implemented via a vehicle computer that includes a memory and a processor programmed to execute instructions stored in the memory, that performs a self-check operation after the host vehicle exits a manufacturing plant and before the host vehicle proceeds with a delivery process. The self-check operation includes measuring a battery charge, comparing the battery charge to a predetermined threshold, and commanding an autonomous vehicle controller to proceed with the delivery process as a result of determining that the battery charge exceeds the predetermined value.

The instructions may include commanding a vehicle engine to activate as a result of determining that the battery charge is below the predetermined threshold.

The instructions may include commanding the vehicle engine to activate to charge a vehicle battery as a result of determining that the battery charge is below the predetermined threshold, the host vehicle is parked outside, the host vehicle has sufficient fuel to charge the battery and complete the delivery process, and the host vehicle is not currently being transported.

The instructions may include commanding the autonomous vehicle controller to navigate the host vehicle to a quality hold area as a result of determining that the battery charge is below the predetermined threshold.

The instructions may include commanding a communication transceiver to send a notification to a remote server as a result of determining that a vehicle engine cannot be activated to charge a vehicle battery after determining that the battery charge is below the predetermined threshold.

The self-check operation may include measuring a pressure of each tire of the host vehicle. In that instance, the instructions may include comparing the pressure of each tire of the host vehicle to a predetermined value. Moreover, the instructions may include commanding the autonomous vehicle controller to navigate the host vehicle to a quality hold area as a result of determining that the pressure of at least one tire of the host vehicle is below the predetermined value. Alternatively or in addition, the instructions may include commanding the autonomous vehicle controller to navigate the host vehicle to a quality hold area as a result of determining that the pressure of at least one tire of the host vehicle exceeds the predetermined value.

The instructions may include determining whether the host vehicle is currently being transported, wherein the processor is programmed to determine that the host vehicle is currently being transported as a result of receiving signals transmitted from a communication beacon located on a loading ramp used for transporting the host vehicle during the delivery process.

A method for performing a vehicle self-check operation after a host vehicle exits a manufacturing plant and before the host vehicle proceeds with a delivery process includes measuring a battery charge, comparing the battery charge to a predetermined threshold, and commanding an autonomous vehicle controller to proceed with the delivery process as a result of determining that the battery charge exceeds the predetermined value.

The method may further include commanding a vehicle engine to activate as a result of determining that the battery charge is below the predetermined threshold.

The method may further include commanding the vehicle engine to activate to charge a vehicle battery as a result of determining that the battery charge is below the predetermined threshold, the host vehicle is parked outside, the host vehicle has sufficient fuel to charge the battery and complete the delivery process, and the host vehicle is not currently being transported.

The method may further include commanding the autonomous vehicle controller to navigate the host vehicle to a quality hold area as a result of determining that the battery charge is below the predetermined threshold.

The method may further include commanding a communication transceiver to send a notification to a remote server as a result of determining that a vehicle engine cannot be activated to charge a vehicle battery after determining that the battery charge is below the predetermined threshold.

The method may further include measuring a pressure of each tire of the host vehicle. In that instance, the method may further include comparing the pressure of each tire of the host vehicle to a predetermined value. Moreover, the method may further include commanding the autonomous vehicle controller to navigate the host vehicle to a quality hold area as a result of determining that the pressure of at least one tire of the host vehicle is below the predetermined value. Alternatively or in addition, the method may further include commanding the autonomous vehicle controller to navigate the host vehicle to a quality hold area as a result of determining that the pressure of at least one tire of the host vehicle exceeds the predetermined value.

The method may further include determining whether the host vehicle is currently being transported based at least in part on signals transmitted from a communication beacon located on a loading ramp used for transporting the host vehicle during the delivery process.

The elements shown may take many different forms and include multiple and/or alternate components and facilities. The example components illustrated are not intended to be limiting. Indeed, additional or alternative components and/or implementations may be used. Further, the elements shown are not necessarily drawn to scale unless explicitly stated as such.

As illustrated in FIG. 1, a host vehicle 100 includes a self-check system 105 for periodically monitoring the battery and tire pressure during a delivery process and other situations when the host vehicle 100 is parked for extended periods of time (e.g., more than a 2 days). Although illustrated as a sedan, the host vehicle 100 may include any passenger or commercial automobile such as a car, a truck, a sport utility vehicle, a crossover vehicle, a van, a minivan, a taxi, a bus, etc. The host vehicle 100 is an autonomous vehicle that can operate in an autonomous (e.g., driverless) mode, a partially autonomous mode, and/or a non-autonomous mode. The partially autonomous mode may refer to the SAE Level 2 mode of operation where the host vehicle 100 can control steering, acceleration, and braking under certain circumstances without human interaction. The partially autonomous mode may further refer to the SAE Level 3 mode of operation where the host vehicle 100 can handle steering, acceleration, and braking under certain circumstances, as well as monitoring of the driving environment, even though some human interaction is sometimes needed.

The self-check system 105, discussed in greater detail below, performs a self-check operation during the delivery process of the host vehicle 100. The self-check operation may include checking the battery charge, the tire pressure, or both. The delivery process may refer to the process of getting the host vehicle 100 from the manufacturing plant to the end customer. The end customer may refer to a dealership or an individual owner of the vehicle separate from the vehicle manufacturer. The delivery process may include the host vehicle 100 exiting the manufacturing plant, being parked in a lot at the manufacturing plant, being loaded for transport via, e.g., a rail car, ship, or truck, being transported by rail car, ship, or truck, exiting the rail car, ship, or truck, being parked in a lot after exiting the rail car, ship, or truck, etc.

Upon detecting low battery charge or low tire pressure, the self-check system 105 may notify a transportation management entity that the battery charge, the tire pressure, or both, need attention. The transportation management entity may refer to the entity or entities responsible for transporting the host vehicle 100 from the manufacturing plant to the end customer.

In the case of a low battery charge, the self-check system 105 may start the vehicle engine to charge the battery, at least until the battery charge is above a predetermined level. The self-check system 105 may refrain from starting the engine to charge the battery at certain times, however. For instance, the self-check system 105 may not charge the battery when the host vehicle 100 is loaded for transport. Further, the self-check system 105 may not charge the battery when the host vehicle 100 is parked indoors. As discussed in greater detail below, the self-check system 105 may determine that the host vehicle 100 is loaded for transport or is parked indoors based on various sensors. Further, before starting the engine, the self-check system 105 may confirm that the host vehicle 100 has sufficient fuel to charge the battery and operate the host vehicle 100 during the delivery process.

The self-check system 105 may perform the self-check operation after a predetermined amount of time has elapsed since the last self-check. Alternatively, the predetermined amount of time may refer to an amount of time that the host vehicle 100 has been continuously parked. The predetermined amount of time may be on the order of, e.g., 2 days. Different predetermined amounts of time may apply depending on whether the host vehicle 100 is in the delivery process or with the end customer. Also, different amounts of time may apply based on the particular phase of the delivery process. That is, one predetermined amount of time may apply while the host vehicle 100 is parked outside the manufacturing plant and a different predetermined amount of time may apply while the host vehicle 100 is parked after transport. Further, as mentioned above, the self-check may not occur (the predetermined amount of time is infinite) when the host vehicle 100 is indoors or loaded for transport.

If the self-check system 105 determines that the self-check operation is unable to adequately address the issue (e.g., low battery charge or low tire pressure), the self-check system 105 may command the host vehicle 100 to navigate to a "quality hold" location where the host vehicle 100 can be serviced before proceeding with the delivery process. Examples of reasons the self-check system 105 may not be able to address the issue could include insufficient fuel to charge the battery and complete the delivery process, inability to fill the tires with air, inability to determine if the host vehicle 100 is parked indoors, or the like.

Figure 2:
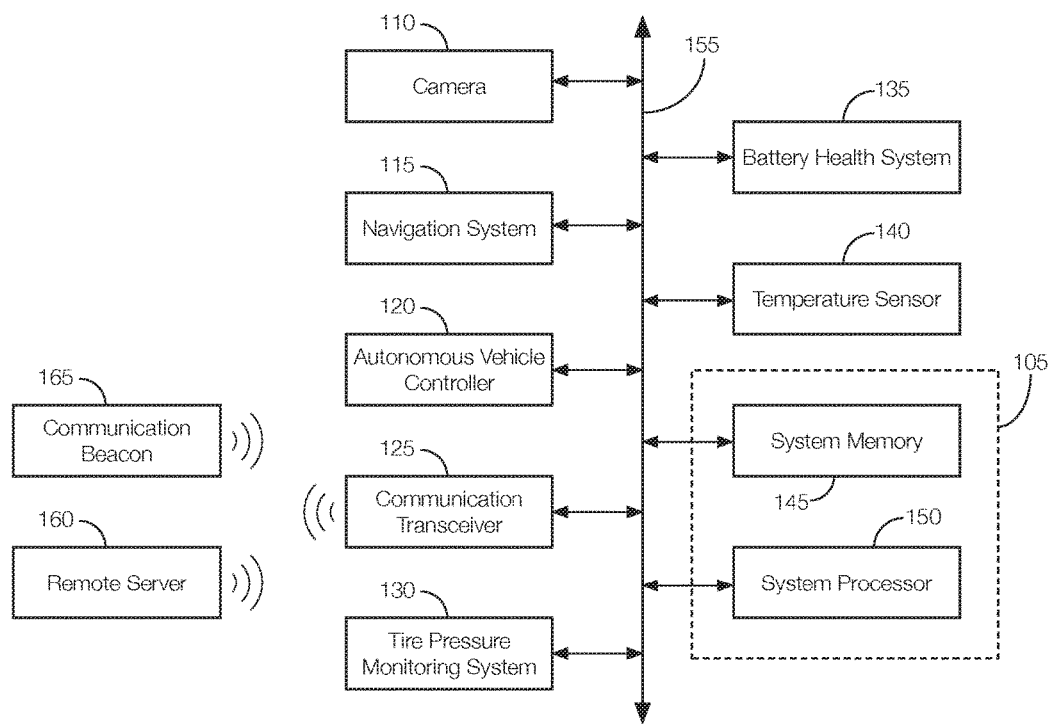
FIG. 2 is a block diagram showing example components of the autonomous vehicle, including components of the self-check system.

Referring now to FIG. 2, components of the self-check system 105 may communicate with components of the host vehicle 100. Example components of the host vehicle 100 may include a camera 110, a navigation system 115, an autonomous vehicle controller 120, a communication transceiver 125, a tire pressure monitoring system 130, a battery health system 135, and a temperature sensor 140. The self-check system 105 may be implemented via a vehicle computer. As such, the self-check system 105 may include a system memory 145 and a system processor 150. At least some of these components may be in communication with one another via a vehicle communication network 155.

The vehicle communication network 155 includes hardware, such as a communication bus, for facilitating communication among the vehicle components. The communication network may facilitate wired or wireless communication among the vehicle components in accordance with a number of communication protocols such as controller area network (CAN), Ethernet, WiFi, Local Interconnect Network (LIN), and/or other wired or wireless mechanisms.

The camera 110 is a vision sensor. The camera 110 may capture images of an area external to the host vehicle 100. To capture such images, the camera 110 may include a lens that projects light toward, e.g., a CCD image sensor, a CMOS image sensor, etc. The camera 110 processes the light and generates the image. The image may be output to the system processor 150 and, as discussed in greater detail below, can be used to determine if the host vehicle 100 is parked indoors.

The navigation system 115 is implemented via circuits, chips, or other electronic components that can determine a present location of the host vehicle 100. The navigation system 115 may be implemented via satellite-based system such as the Global Positioning System (GPS). The navigation system 115 may triangulate the location of the host vehicle 100 based on signals received from various satellites in the Earth's orbit. The navigation system 115 is programmed to output signals representing the present location of the host vehicle 100 to, e.g., the autonomous vehicle controller 120 via the communication network. In some instances, the navigation system 115 is programmed to determine a route from the present location to a future location, including developing alternative routes to, e.g., the quality hold area when necessary. The navigation system 115 may access a virtual map stored in an electronic memory and develop routes according to the virtual map data. Further, in some possible implementations, the signals output by the navigation system 115 may be used to determine whether the host vehicle 100 is parked indoors.

The autonomous vehicle controller 120, implemented via circuits, chips, or other electronic components, is programmed to carry out various operations. The autonomous vehicle controller 120 is a computing device that generally includes a processor and a memory, the memory including one or more forms of computer-readable media, and storing instructions executable by the processor for performing various autonomous vehicle operations, including as disclosed herein. The memory of the autonomous vehicle controller 120 further generally stores remote data received via various communications mechanisms; e.g., the autonomous vehicle controller 120 is generally programmed to communicate via a controller area network (CAN) bus or the like, and/or for using other wired or wireless protocols, e.g., Bluetooth, etc. Via the vehicle communication network 155, the autonomous vehicle controller 120 may transmit messages to, and receive messages from, various devices in the host vehicle 100. Examples of such devices may include controllers, actuators, sensors, etc. As such the autonomous vehicle controller 120 is programmed to carry out any of the autonomous modes of operation discussed above by processing the sensor data and outputting control signals to, e.g., actuators associated with the acceleration, breaking, and steering of the host vehicle 100.

The communication transceiver 125 is implemented via an antenna, circuits, chips, or other electronic components that facilitate wireless communication between the host vehicle 100 and other objects, such as other vehicles, a remote server 160, etc. The communication transceiver 125 may be programmed to communicate in accordance with any number of wired or wireless communication protocols. For instance, the communication transceiver 125 may be programmed to communicate in accordance with a satellite-communication protocol, a cellular-based communication protocol (LTE, 3G, etc.), Bluetooth®, Bluetooth® Low Energy, Ethernet, the Controller Area Network (CAN) protocol, WiFi, the Local Interconnect Network (LIN) protocol, etc. In some instances, the communication transceiver 125 is incorporated into a vehicle telematics unit. The remote server 160 may be associated with a transportation management entity. Therefore, the communication transceiver 125 may be programmed to send messages to the remote server 160 indicating, e.g., that the host vehicle 100 needs maintenance during the delivery process. Moreover, the communication transceiver 125 may be programmed to wirelessly communicate with a communication beacon 165 on loading ramp 170 (see FIG. 3) of a rail car, ship, or truck. The communication transceiver 125 may be programmed to receive messages from the communication beacon 165. The messages may indicate the presence of the host vehicle 100 at the loading ramp 170.

The tire pressure monitoring system 130 is implemented via sensors, circuits, chips, or other electronic components located in each of the tires of the host vehicle 100. The sensors of the tire pressure monitoring system 130 are programmed to detect the pressure of their respective tire. Communication chips broadcast or otherwise communicate the detected tire pressure to other vehicle components, including the system processor 150.

The battery health system 135 is implemented via circuits, chips, or other electronic components that are programmed to detect the state of charge of the vehicle battery. The state of charge may represent the amount of charge available to power certain vehicle subsystems. The battery health system 135 may be programmed to output a signal to, e.g., the system processor 150, representing the state of charge of the battery. In some instances, the state of charge may be represented as a percentage. A "low" state of charge may be on the order of, e.g., 70% state of charge or lower.

The temperature sensor 140 is implemented via circuits, chips, or other electronic components that detect the ambient temperature outside the host vehicle 100. The temperature sensor 140 may generate and output a signal representing the ambient temperature outside the host vehicle 100, the temperature signal may be output to, e.g., the system processor 150.

The system memory 145 is implemented via circuits, chips or other electronic components and can include one or more of read only memory (ROM), random access memory (RAM), flash memory, electrically programmable memory (EPROM), electrically programmable and erasable memory (EEPROM), embedded MultiMediaCard (eMMC), a hard drive, or any volatile or non-volatile media etc. The system memory 145 may store instructions executable by the system processor 150 and data such as the battery state of charge, the tire pressures, the ambient air temperature, etc. The instructions and data stored in the memory may be accessible to the system processor 150 and possibly other components of the self-check system 105, the host vehicle 100, or both.

The system processor 150 is implemented via circuits, chips, or other electronic component and may include one or more microcontrollers, one or more field programmable gate arrays (FPGAs), one or more application specific integrated circuits (ASICs), one or more digital signal processors (DSPs), one or more customer specific integrated circuits, etc. The system processor 150 can receive the data from the sensors, including the sensors associated with the battery health system 135 and the tire pressure monitoring system 130, and determine, from the data, whether the battery charge and tire pressures are sufficient for the host vehicle 100 to proceed in the delivery process. Moreover, in the instance of the battery charge, the system processor 150 may be programmed to start the engine of the host vehicle 100 to charge the battery.

The system processor 150 may be programmed to perform the self-check operation during the delivery process of the host vehicle 100. As previously explained, the self-check operation may include checking the battery charge, the tire pressures, or both. Thus, the system processor 150 may be programmed to receive and process signals output by the battery health system 135, the tire pressure monitoring system 130, or both, to determine the battery charge and tire pressures. Upon detecting low battery charge or low tire pressure, the system processor 150 may be programmed to command the communication transceiver 125 to transmit a notification to the remote server 160 of the transportation management entity that the battery charge, the tire pressure, or both, need attention. Further, in some instances, such as instances that the system processor 150 cannot correct without human intervention (e.g., low tire pressure), the system processor 150 may output a signal commanding the autonomous vehicle controller 120 to navigate the host vehicle 100 to the quality hold area.

In the case of a low battery charge, the system processor 150 may be programmed to output a command to start the vehicle engine to charge the battery, at least until the battery charge is above a predetermined level. The system processor 150 may be programmed to refrain from starting the engine to charge the battery at certain times, however. For instance, the system processor 150 may be programmed to refrain from charging the battery when the host vehicle 100 is loaded for transport. Further, the system processor 150 may be programmed to refrain from charging the battery when the host vehicle 100 is parked indoors. The system processor 150 may be programmed to determine that the host vehicle 100 is loaded for transport or is parked indoors based on various sensors. For instance, the system processor 150 may be programmed to determine that the host vehicle 100 is loaded for transport based on a signal received from the communication transceiver 125 indicating that the communication transceiver 125 is near a communication beacon 165 located on the loading ramp 170 of a rail car, ship, or truck. The system processor 150 may be programmed to determine that the host vehicle 100 is parked indoors based on, e.g., signals output by the camera 110, navigations system, or both.

Further, before starting the engine, the system processor 150 may be programmed to confirm that the host vehicle 100 has sufficient fuel to charge the battery and operate the host vehicle 100 during the delivery process. The system processor 150 may be programmed to determine whether the host vehicle 100 has sufficient fuel based on a signal output by a fuel level sensor.

The system processor 150 may be programmed to periodically perform the self-check operation during the delivery process, and possibly even after the host vehicle 100 has been delivered to the end customer. For instance, the system processor 150 may be programmed to perform the self-check operation after a predetermined amount of time has elapsed since the last self-check operation was performed during the delivery process. Alternatively, the predetermined amount of time may refer to an amount of time that the host vehicle 100 has been continuously parked. This could include when the host vehicle 100 is continuously parked by the end customer after the delivery process has ended. The predetermined amount of time may be on the order of, e.g., 2 days. Different predetermined amounts of time may apply depending on whether the host vehicle 100 is in the delivery process or with the end customer. Also, different amounts of time may apply based on the particular phase of the delivery process. That is, one predetermined amount of time may apply while the host vehicle 100 is parked outside the manufacturing plant and a different predetermined amount of time may apply while the host vehicle 100 is parked after transport. Further, as mentioned above, the self-check may not occur (the predetermined amount of time is infinite) when the host vehicle 100 is indoors or loaded for transport.

If the system processor 150 determines that the self-check operation is unable to adequately address the issue (e.g., low battery charge or low tire pressure), the system processor 150 may be programmed to command the host vehicle 100 to navigate to the quality hold location where the host vehicle 100 can be serviced before proceeding with the delivery process. Examples of reasons the self-check system 105 may not be able to address the issue could include the system processor 150 detecting insufficient fuel to charge the battery and complete the delivery process, the system processor 150 detecting low air pressure in one or more tires, the system processing being unable to determine if the host vehicle 100 is parked indoors, or the like.

Figure 3:
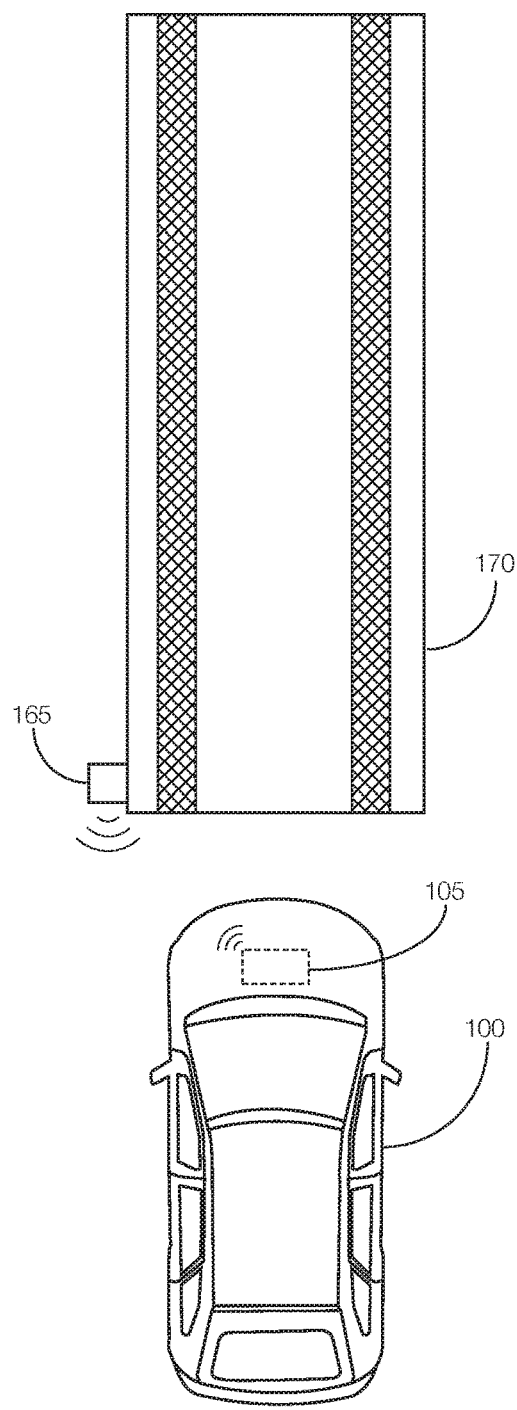
FIG. 3 illustrates the autonomous vehicle approaching a loading ramp with a communication beacon.

FIG. 3 illustrates the host vehicle 100 approaching a loading ramp 170 for loading the host vehicle 100 for transport via rail car, ship, or truck. Alternatively, the loading ramp 170 could also be a driveway to an indoor parking facility such as a parking garage. The loading ramp 170 includes a communication beacon 165, as mentioned above. The communication beacon 165 is implemented via an antenna, circuits, chips, or other electronic components programmed to wirelessly communicate with the communication transceiver 125 of the host vehicle 100 when both are within range of one another. The communication beacon 165 may communicate with any number of communication protocols. For instance, the communication beacon 165 may communicate in accordance with Bluetooth®, Bluetooth® Low Energy (BLE) or the like. The communication beacon 165 may be programmed to facilitate single or bidirectional communication with the communication transceiver 125 of the host vehicle 100.

As the host vehicle 100 approaches the loading ramp 170, the communication transceiver 125 receives messages broadcast by the communication beacon 165. The system processor 150 may be programmed to interpret the receipt of the message broadcast by the communication beacon 165 as the host vehicle 100 being near the loading ramp 170. In some instances, the system processor 150 may be programmed to determine the distance of the host vehicle 100 to the communication beacon 165 based on the signals transmitted from the communication beacon 165. Further, the system processor 150 may be programmed to refrain from executing the self-check operation, or at least starting the engine to charge the battery, as a result of detecting that the host vehicle 100 is near the loading ramp 170.

In some possible approaches, such as where the communication beacon 165 is implemented via a bidirectional BLE, the system processor 150 may be programmed to detect transitions between the "on" and "off" sides of the communication beacon 165. The system processor 150 may be programmed to respond to signals representing such transitions by deactivating and activating, respectively, the self-check operation. To further increase robustness, the communication beacon 165 may include an orientation sensor. With this approach, the system processor 150 may be programmed to determine that the self-check operation should be deactivated so long as the host vehicle is on the "on" side of the communication beacon 165 and the orientation of the host vehicle 100 matches that the communication beacon 165, indicating that the host vehicle 100 is on or about to enter the loading ramp 170.

Figure 4:
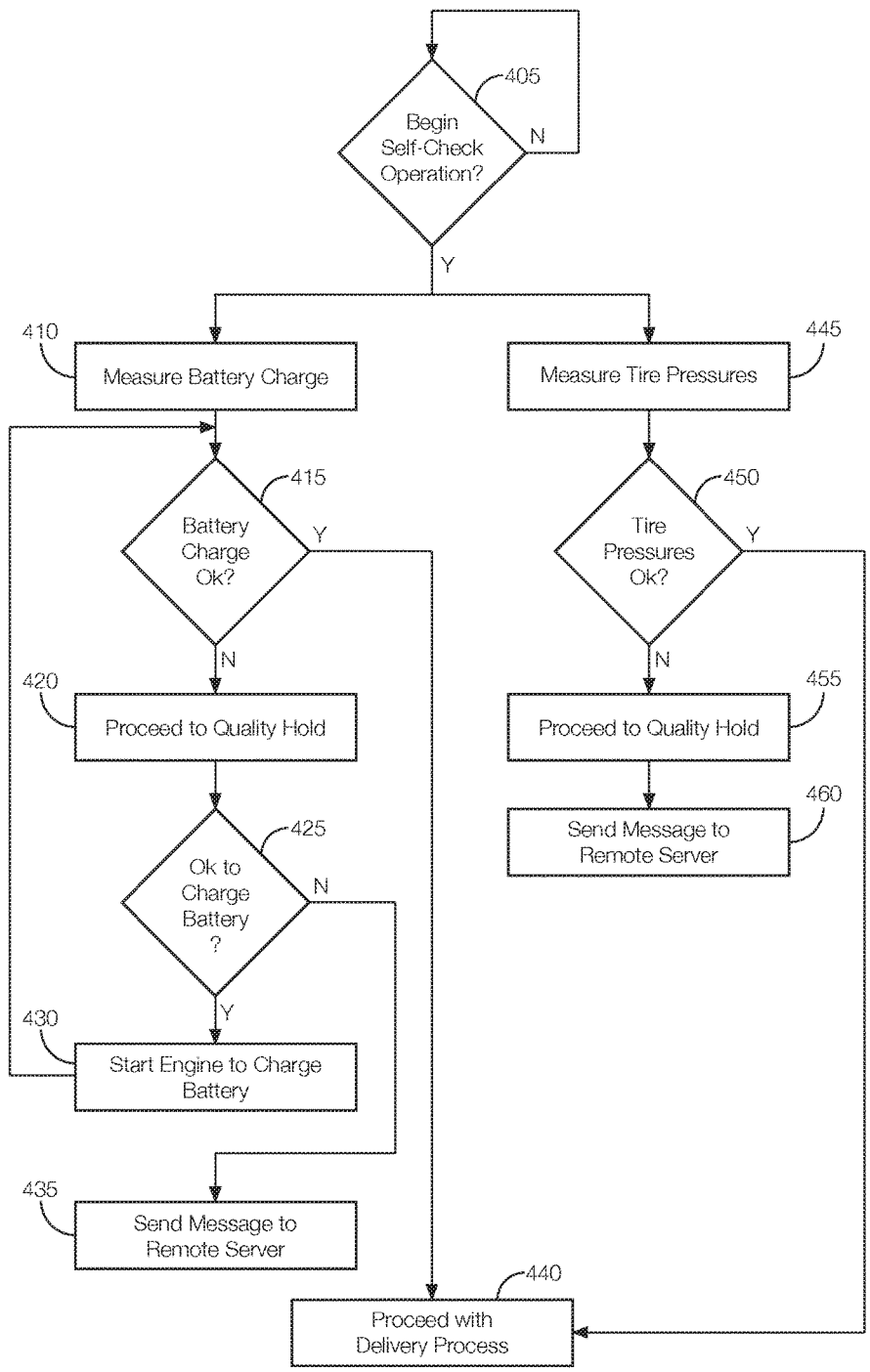
FIG. 4 is a flowchart of an example process that may be executed by the self-check system when released from a manufacturing plant.

FIG. 4 is a flowchart of an example process 400 that may be executed by the self-check system 105 when the host vehicle 100 is released from a manufacturing plant. The process 400 may begin at any time while, e.g., the host vehicle 100 is parked at the manufacturing plant and before proceeding with the delivery process.

At decision block 405, the self-check system 105 determines whether to begin the self-check operation. The system processor 150, for example, may be programmed to begin the self-check operation after confirming that the host vehicle 100 has exited the manufacturing plant and is ready for transport. If the system processor 150 determines that it is time to begin the self-check operation, the process 400 may proceed with blocks 410 and 445. If the system processor 150 determines that it is not time to begin the self-check operation, the process 400 may repeat block 405 until the self-check operation should begin. The system processor 150 may be programmed to wait a short amount of time (e.g., several minutes or hours) before executing block 405 again.

At block 410, the self-check system 105 measures the battery charge. To measure the battery charge, the system processor 150 may be programmed to command the battery health system 135 to determine the state of charge of the vehicle battery and output a signal, to the system processor 150, representing the battery charge.

At decision block 415, the self-check system 105 determines if the battery charge is sufficient for the delivery process. The system processor 150 may be programmed to compare the battery charge to a predetermined threshold. An example predetermined threshold may be on the order of, e.g., 70%. If the battery charge meets or exceeds the predetermined threshold, the process 400 may proceed to block 440. If the system processor 150 determines that the battery charge is below the predetermined threshold, the process 400 may proceed to block 420.

At block 420, the self-check system 105 proceeds to the quality hold area. The system processor 150 may be programmed to command the autonomous vehicle controller 120 to navigate the host vehicle 100 to the quality hold area.

At decision block 425, the self-check system 105 determines whether to charge the battery. The system processor 150 may be programmed to activate the vehicle engine to charge the battery so long as certain criteria are met. The criteria may include, e.g., whether the host vehicle 100 is parked outside, whether the host vehicle 100 is currently being transported on, e.g., a rail car, ship, or trailer, whether the host vehicle 100 has sufficient fuel to charge the battery and complete the delivery process, whether the host vehicle 100 has arrived at the quality hold area, etc. If the system processor 150 determines that the criteria are met, the process 400 proceeds to block 430. If the system processor 150 determines that the criteria are not met, the process 400 proceeds to block 435.

At block 430, the self-check system 105 activates the vehicle engine to charge the battery. For instance, the system processor 150 is programmed to output a signal to the vehicle engine that causes the vehicle engine to start. Alternatively, the system processor 150 may output a signal to the autonomous vehicle controller 120 commanding the autonomous vehicle controller 120 to start the engine. The system processor 150 or the autonomous vehicle controller 120 may be programmed to monitor the battery charge and disable the engine when the battery charge exceeds a threshold that may be different from (e.g., higher than) the threshold applied at block 415. The process 400 may return to block 415 after the battery is charged At block 435, the self-check system 105 sends a message to the remote server 160. The system processor 150 may be programmed to command the communication transceiver 125 to send a notification to the remote server 160. The notification may indicate that the battery charge is low and that the self-check system 105 is unable to sufficiently charge the battery for the host vehicle 100 to complete the delivery process. In that instance, the process 400 may end after block 435. In other possible approaches, the notification to the remote server 160 may request approval to charge the battery anyway. For instance, if the system processor 150 determines that it cannot charge the battery because, e.g., the host vehicle 100 may be parked indoors, the system processor 150 may prompt the user to check the vehicle surroundings via, e.g., images captured by the camera 110 and override the result at block 425 if the user confirms that the host vehicle 100 is not parked indoors. This may occur if, e.g., the system processor 150 determines that the host vehicle 100 is parked in an enclosed garage as opposed to a ventilated parking garage. If the user override is received, the process 400 may proceed to block 430. Otherwise, the process 400 may begin again (e.g., return to block 405) at a certain point so that the battery charge can be reevaluated after the battery charge is corrected and before the host vehicle 100 embarks on the delivery process.

At block 440, the self-check system 105 clears the host vehicle 100 to continue with the delivery process. That is, the system processor 150 may be programmed to notify the autonomous vehicle controller 120 that the autonomous vehicle controller 120 can proceed with the delivery process if block 440 of the process is reached from both blocks 415 and 450. If the system processor 150 reaches block 440 from block 415 or block 450 (but not both), the system processor 150 may wait to notify the autonomous vehicle controller 120 until both the battery charge (block 415) and tire pressures (block 450) have been evaluated and cleared.

At block 445, the self-check system 105 measures the tire pressures of all tires of the host vehicle 100. To measure the tires, the system processor 150 may be programmed to command the tire pressure monitoring system 130 to measure the pressures of each tire and output a signal, to the system processor 150, representing the measured tire pressures. In some instances, the system processor 150 may be programmed to determine how long the host vehicle 100 has been stationary before measuring the tire pressure. If the host vehicle 100 has not been stationary for a predetermined amount of time, the system processor 150 may wait for the tires to cool before measuring the tire pressure and proceeding to block 450.

At decision block 450, the self-check system 105 determines if the tire pressures are sufficient for the delivery process. The system processor 150 may be programmed to compare the tire pressures to a predetermined value. An example predetermined value may be the recommended pressure for the tires. As mentioned above, the system processor 150 may be programmed to account for the ambient air temperature when evaluating the tire pressure relative to the predetermined value. That is, the system processor 150 may be programmed to adjust the predetermined value in light of the ambient air temperature measured by the temperature sensor 140. If the tire pressure of each tire is approximately equal to the predetermined value, the process 400 may proceed to block 440. If the system processor 150 determines that the tire pressure of one or more tires is too far above or below the predetermined value (e.g., more than 2-3 psi above or below the predetermined value), the process 400 may proceed to block 455.

At block 455, the self-check system 105 proceeds to the quality hold area. The system processor 150 may be programmed to command the autonomous vehicle controller 120 to navigate the host vehicle 100 to the quality hold area so, e.g., the tire pressures can be adjusted to the predetermined value.

At block 460, the self-check system 105 sends a message to the remote server 160. The system processor 150 may be programmed to command the communication transceiver 125 to send a notification to the remote server 160. The notification may indicate that the tire pressure of one or more tires is either too low or too high. The notification may further indicate which tire requires attention. The process 400 may end after block 460. The process 400 may begin again (e.g., return to block 405) at a certain point so that the tire pressures can be reevaluated after the tire pressures are corrected and before the host vehicle 100 embarks on the delivery process.

Figure 5:
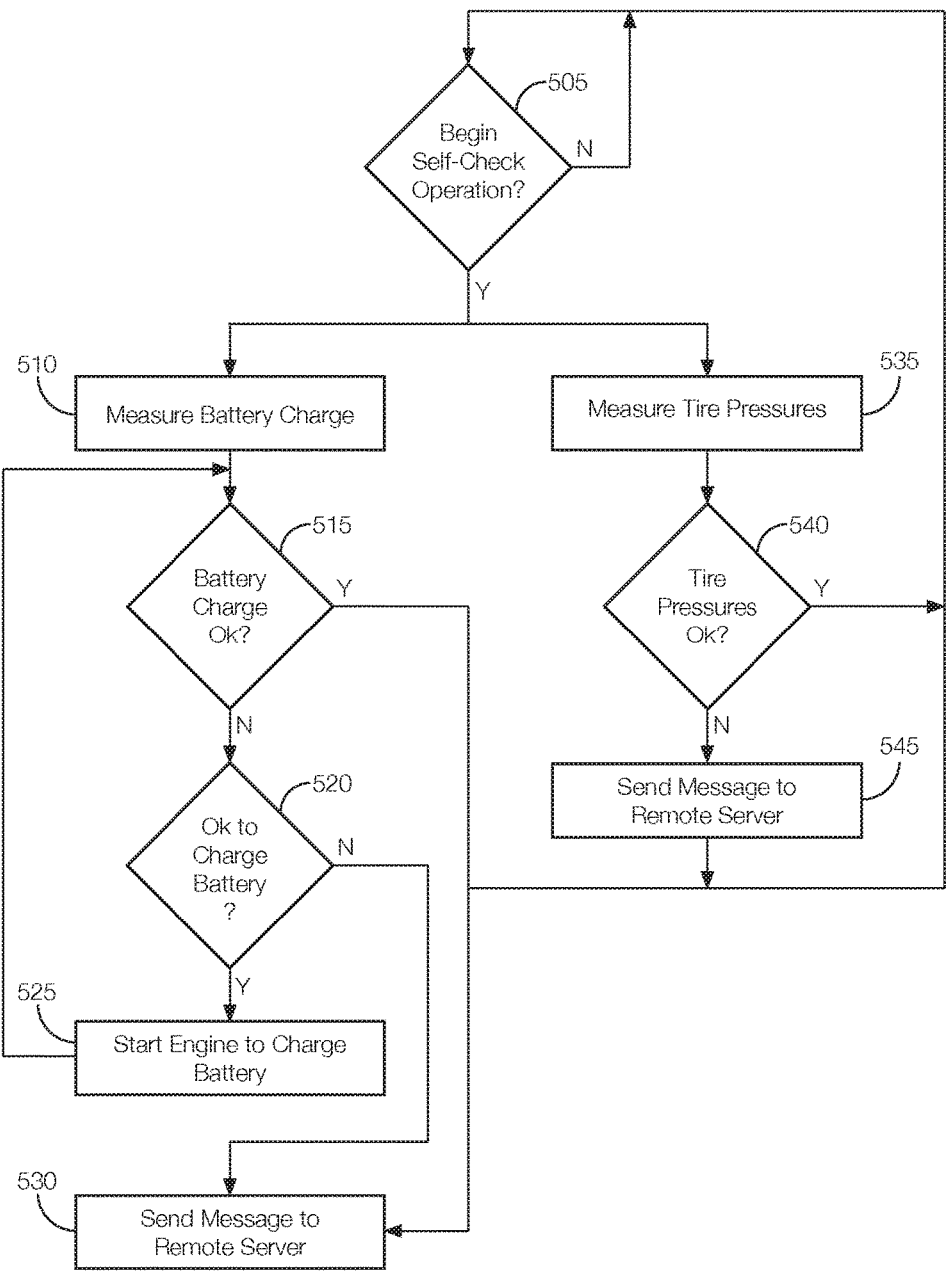
FIG. 5 is a flowchart of an example process that may be executed by the self-check system when at a point of rest during transportation or when parked by an end customer for a predetermined amount of time.

FIG. 5 is a flowchart of an example process 500 that may be executed by the self-check system 105 when at a point of rest during transportation or when parked by an end customer for a predetermined amount of time (e.g., 2 days or so).

At decision block 505, the self-check system 105 determines whether to begin the self-check operation. The system processor 150, for example, may be programmed to begin the self-check operation after confirming that the host vehicle 100 has been parked and not started for the predetermined amount of time, or that the predetermined amount of time has elapsed since the last time the self-check operation was run and that the host vehicle 100 has not been used during that time. If the system processor 150 determines that it is time to begin the self-check operation, the process 500 may proceed with blocks 510 and 535. If the system processor 150 determines that it is not time to begin the self-check operation, the process 500 may repeat block 505 until the self-check operation should begin. The system processor 150 may be programmed to wait a short amount of time (e.g., several minutes or hours) before executing block 505 again.

At block 510, the self-check system 105 measures the battery charge. To measure the battery charge, the system processor 150 may be programmed to command the battery health system 135 to determine the state of charge of the vehicle battery and output a signal, to the system processor 150, representing the battery charge.

At decision block 515, the self-check system 105 determines if the battery charge meets or exceeds a predetermined threshold associated with starting the engine and running various accessories during use of the host vehicle 100. The system processor 150 may be programmed to compare the battery charge to the predetermined threshold. An example predetermined threshold may be on the order of, e.g., 70%. If the battery charge meets or exceeds the predetermined threshold, the process 500 may return to block 505. If the system processor 150 determines that the battery charge is below the predetermined threshold, the process 500 may proceed to block 520.

At decision block 520, the self-check system 105 determines whether to charge the battery. The system processor 150 may be programmed to activate the vehicle engine to charge the battery so long as certain criteria are met. The criteria may include, e.g., whether the host vehicle 100 is parked outside, whether the host vehicle 100 is not currently being transported via, e.g., a rail car, ship, or truck, whether the host vehicle 100 has sufficient fuel to charge the battery and complete the delivery process or navigate to a refueling station, whether the host vehicle 100 has arrived at the quality hold area, etc. If the system processor 150 determines that the criteria are met, the process 500 proceeds to block 525. If the system processor 150 determines that the criteria are not met, the process 500 proceeds to block 530.

At block 525, the self-check system 105 activates the vehicle engine to charge the battery. For instance, the system processor 150 is programmed to output a signal to the vehicle engine that causes the vehicle engine to start. Alternatively, the system processor 150 may output a signal to the autonomous vehicle controller 120 commanding the autonomous vehicle controller 120 to start the engine. The system processor 150 or the autonomous vehicle controller 120 may be programmed to monitor the battery charge and disable the engine when the battery charge exceeds a threshold that may be different from (e.g., higher than) the threshold applied at block 515. The process 500 may return to block 515 after the battery is charged At block 530, the self-check system 105 sends a message to the remote server 160. The system processor 150 may be programmed to command the communication transceiver 125 to send a notification to the remote server 160. The notification may indicate that the battery charge is low and that the self-check system 105 is unable to charge the battery. If the process 500 is executed during the delivery process, the notification may be sent to a remote server 160 associated with the transportation management entity. If the process 500 is executed after the host vehicle 100 is delivered to an end customer, the remote server 160 may be an email server that can send an email or text message to the end customer. In some possible approaches, the notification to the remote server 160 may request approval to charge the battery anyway. For instance, if the system processor 150 determines that it cannot charge the battery because, e.g., the host vehicle 100 may be parked indoors, the system processor 150 may prompt the user to check the vehicle surroundings via, e.g., images captured by the camera 110 and override the result at block 520 if the user confirms that the host vehicle 100 is not parked indoors. This may occur if, e.g., the system processor 150 determines that the host vehicle 100 is parked in an enclosed garage as opposed to a ventilated parking garage. If the user override is received, the process 500 may proceed to block 525. Otherwise, the process 500 may proceed to block 505 after the notification is sent.

At block 535, the self-check system 105 measures the tire pressures of all tires of the host vehicle 100. To measure the tires, the system processor 150 may be programmed to command the tire pressure monitoring system 130 to measure the pressures of each tire and output a signal, to the system processor 150, representing the measured tire pressures. In some instances, the system processor 150 may be programmed to determine how long the host vehicle 100 has been stationary before measuring the tire pressure. If the host vehicle 100 has not been stationary for a predetermined amount of time, the system processor 150 may wait for the tires to cool before measuring the tire pressure and proceeding to block 450.

At decision block 540, the self-check system 105 determines if the tire pressures are sufficient. The system processor 150 may be programmed to compare the tire pressures to a predetermined value. An example predetermined value may be the recommended pressure for the tires. As mentioned above, the system processor 150 may be programmed to account for the ambient air temperature when evaluating the tire pressure relative to the predetermined value. That is, the system processor 150 may be programmed to adjust the predetermined value in light of the ambient air temperature measured by the temperature sensor 140. If the tire pressure of each tire is approximately equal to the predetermined value, the process 500 may return to block 505. If the system processor 150 determines that the tire pressure of one or more tires is too far above or below the predetermined value (e.g., more than 2-3 psi above or below the predetermined value), the process 500 may proceed to block 545.

At block 545, the self-check system 105 sends a message to the remote server 160. The system processor 150 may be programmed to command the communication transceiver 125 to send a notification to the remote server 160. The notification may indicate that the tire pressure of one or more tires is either too low or too high. The notification may further indicate which tire requires attention. If the process 500 is executed during the delivery process, the notification may be sent to a remote server 160 associated with the transportation management entity. If the process 500 is executed after the host vehicle 100 is delivered to an end customer, the remote server 160 may be an email server that can send an email or text message to the end customer. The process 500 return to block 505 after the notification is sent.

In general, the computing systems and/or devices described may employ any of a number of computer operating systems, including, but by no means limited to, versions and/or varieties of the Ford Sync® application, AppLink/Smart Device Link middleware, the Microsoft Automotive® operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A vehicle computer comprising:
   a memory; and
   a processor programmed to execute instructions stored in the memory, the instructions including performing a self-check operation on a host vehicle after the host vehicle exits a manufacturing plant and before the host vehicle proceeds with a delivery process, the self-check operation including measuring a battery charge, comparing the battery charge to a predetermined threshold, and commanding an autonomous vehicle controller to proceed with the delivery process as a result of determining that the battery charge exceeds the predetermined value.

2. The vehicle computer of claim 1, wherein the instructions include commanding a vehicle engine to activate as a result of determining that the battery charge is below the predetermined threshold.

3. The vehicle computer of claim 1, wherein the instructions include commanding the vehicle engine to activate to charge a vehicle battery as a result of determining that the battery charge is below the predetermined threshold, the host vehicle is parked outside, the host vehicle has sufficient fuel to charge the battery and complete the delivery process, and the host vehicle is not currently being transported.

4. The vehicle computer of claim 1, wherein the instructions include commanding the autonomous vehicle controller to navigate the host vehicle to a quality hold area as a result of determining that the battery charge is below the predetermined threshold.

5. The vehicle computer of claim 1, wherein the instructions include commanding a communication transceiver to send a notification to a remote server as a result of determining that a vehicle engine cannot be activated to charge a vehicle battery after determining that the battery charge is below the predetermined threshold.

6. The vehicle computer of claim 1, wherein the self-check operation includes measuring a pressure of each tire of the host vehicle.

7. The vehicle computer of claim 6, wherein the instructions include comparing the pressure of each tire of the host vehicle to a predetermined value.

8. The vehicle computer of claim 7, wherein the instructions include commanding the autonomous vehicle controller to navigate the host vehicle to a quality hold area as a result of determining that the pressure of at least one tire of the host vehicle is below the predetermined value.

9. The vehicle computer of claim 7, wherein the instructions include commanding the autonomous vehicle controller to navigate the host vehicle to a quality hold area as a result of determining that the pressure of at least one tire of the host vehicle exceeds the predetermined value.

10. The vehicle computer of claim 1, wherein the instructions include determining whether the host vehicle is currently being transported, wherein the processor is programmed to determine that the host vehicle is currently being transported as a result of receiving signals transmitted from a communication beacon located on a loading ramp used for transporting the host vehicle during the delivery process.

11. A method for performing a vehicle self-check operation after a host vehicle exits a manufacturing plant and before the host vehicle proceeds with a delivery process, the method comprising:
    measuring a battery charge;
    comparing the battery charge to a predetermined threshold; and
    commanding an autonomous vehicle controller to proceed with the delivery process as a result of determining that the battery charge exceeds the predetermined value.

12. The method of claim 11, further comprising commanding a vehicle engine to activate as a result of determining that the battery charge is below the predetermined threshold.

13. The method of claim 11, further comprising commanding the vehicle engine to activate to charge a vehicle battery as a result of determining that the battery charge is below the predetermined threshold, the host vehicle is parked outside, the host vehicle has sufficient fuel to charge the battery and complete the delivery process, and the host vehicle is not currently being transported.

14. The method of claim 11, further comprising commanding the autonomous vehicle controller to navigate the host vehicle to a quality hold area as a result of determining that the battery charge is below the predetermined threshold.

15. The method of claim 11, further comprising commanding a communication transceiver to send a notification to a remote server as a result of determining that a vehicle engine cannot be activated to charge a vehicle battery after determining that the battery charge is below the predetermined threshold.

16. The method of claim 11, further comprising measuring a pressure of each tire of the host vehicle.

17. The method of claim 16, further comprising comparing the pressure of each tire of the host vehicle to a predetermined value.

18. The method of claim 17, further comprising commanding the autonomous vehicle controller to navigate the host vehicle to a quality hold area as a result of determining that the pressure of at least one tire of the host vehicle is below the predetermined value.

19. The method of claim 17, further comprising commanding the autonomous vehicle controller to navigate the host vehicle to a quality hold area as a result of determining that the pressure of at least one tire of the host vehicle exceeds the predetermined value.

20. The method of claim 11, further comprising determining whether the host vehicle is currently being transported based at least in part on signals transmitted from a communication beacon located on a loading ramp used for transporting the host vehicle during the delivery process.

* * * * *